United States Patent
Lee et al.

(10) Patent No.: US 7,335,945 B2
(45) Date of Patent: Feb. 26, 2008

(54) MULTI-GATE MOS TRANSISTOR AND METHOD OF MANUFACTURING THE SAME

(75) Inventors: Dae Woo Lee, Daejeon (KR); Tae Moon Roh, Daejeon (KR); Sung Ku Kwon, Daejeon (KR); Il Yong Park, Daejeon (KR); Yil Suk Yang, Daejeon (KR); Byoung Gon Yu, Daejeon (KR); Jong Dae Kim, Daejeon (KR)

(73) Assignee: Electronics and Telecommunications Research Institute, Daejeon-Shi (KR)

( * ) Notice: Subject to any disclaimer, the term of this patent is extended or adjusted under 35 U.S.C. 154(b) by 277 days.

(21) Appl. No.: 11/012,695

(22) Filed: Dec. 16, 2004

(65) Prior Publication Data
US 2005/0224880 A1 Oct. 13, 2005

(30) Foreign Application Priority Data
Dec. 26, 2003 (KR) ............ 10-2003-0097072
Sep. 1, 2004 (KR) ............ 10-2004-0069589

(51) Int. Cl.
*H01L 29/78* (2006.01)
*H01L 21/8234* (2006.01)

(52) U.S. Cl. ............ 257/331; 257/E29.264; 438/270; 438/283

(58) Field of Classification Search ........... 257/331
See application file for complete search history.

(56) References Cited

U.S. PATENT DOCUMENTS 5,965,914 A * 10/1999 Miyamoto ............ 257/331
6,475,890 B1 11/2002 Yu
6,689,650 B2 2/2004 Gambino et al.
6,921,700 B2 * 7/2005 Orlowski et al. ............ 438/283
7,002,207 B2 * 2/2006 Kim et al. ............ 257/331
2005/0112851 A1 * 5/2005 Lee et al. ............ 438/497
2005/0266645 A1 * 12/2005 Park ............ 438/282

OTHER PUBLICATIONS

Fu-Liang, et al.; "25 nm CMOS Omega FET's"; IEEE Photonics Technology Letters, 2002.
J.P. Colinge, et al.; "Silicon-On-Insulator "Gate-All-Around Device""; IEEE Photonics Technology Letters, 1990.

* cited by examiner

*Primary Examiner*—Stephen W. Smoot
(74) *Attorney, Agent, or Firm*—Lowe Hauptman Ham & Berner LLP (57) ABSTRACT

Provided are a multi-gate MOS transistor and a method of manufacturing the same. Two silicon fins are vertically stacked on a silicon on insulator (SOI) substrate, and four side surfaces of an upper silicon fin and three side surfaces of a lower silicon fin are used as a channel. Therefore, a channel width is increased, so that current driving capability of a device is improved, and high performance nano-level semiconductor IC and highly integrated memory IC can be manufactured through the optimization and stability of a process.

21 Claims, 14 Drawing Sheets

FIG. 1a

PRIOR ART

FIG. 1b

PRIOR ART

MULTI-GATE MOS TRANSISTOR AND METHOD OF MANUFACTURING THE SAME

CROSS-REFERENCE TO RELATED APPLICATION

This application claims priorities to, and the benefit of Korean Patent Application Nos. 2003-97072 and 2004-69589 filed Dec. 26, 2004 and Sep. 1, 2004, the disclosure of which are hereby incorporated herein by reference in its entirety.

BACKGROUND

1. Field of the Invention

The present invention relates to a multi-gate MOS transistor and a method of manufacturing the same and, more particularly, to a multi-gate MOS transistor having two silicon fins which are perpendicularly stacked and using four side surfaces of an upper silicon fin and three side surfaces of a lower silicon fin as a channel, and a method of manufacturing the same.

2. Discussion of Related Art

As a semiconductor device is highly integrated, efforts for improving performance such as an operating speed and a driving capability have been made. As a MOSFET has also undergone a continuous size reduction, a problem regarding reliability such as a short channel effect is being caused.

In order to solve such problems, a dual-gate structure which forms a gate electrode on both sides of a channel through which an electrical current flows has been introduced. U.S. Pat. No. 6,413,802 (Jul. 2, 2002) discloses a dual-gate structure which has a channel perpendicularly extended from a substrate. The dual-gate structure suppresses a short channel effect since a gate electrode is formed on both sides of a channel and thus current control capability in the channel by a gate voltage is improved.

Figure 1A:
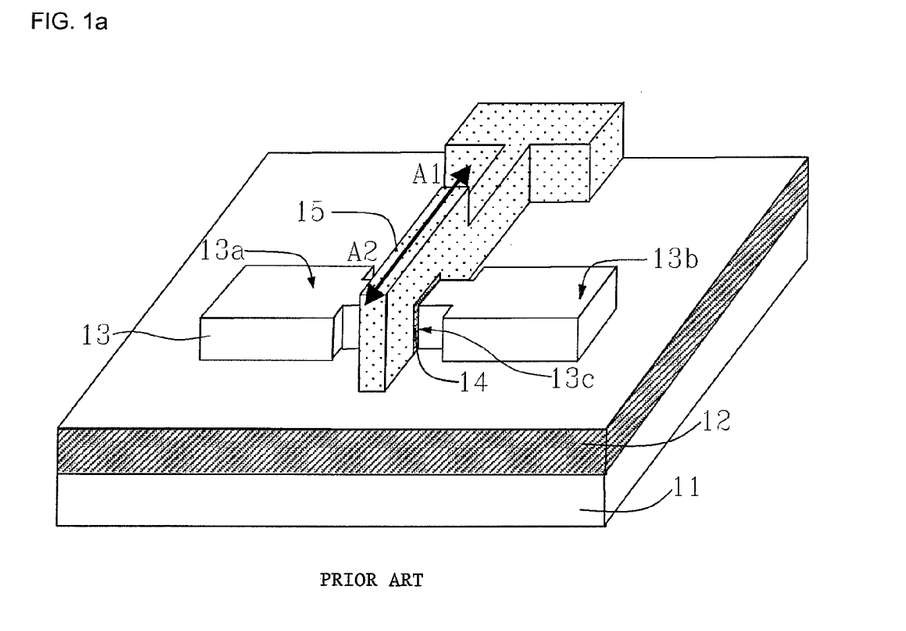
FIG. 1a is a perspective view illustrating a conventional tri-gate FinFET.
Figure 1B:
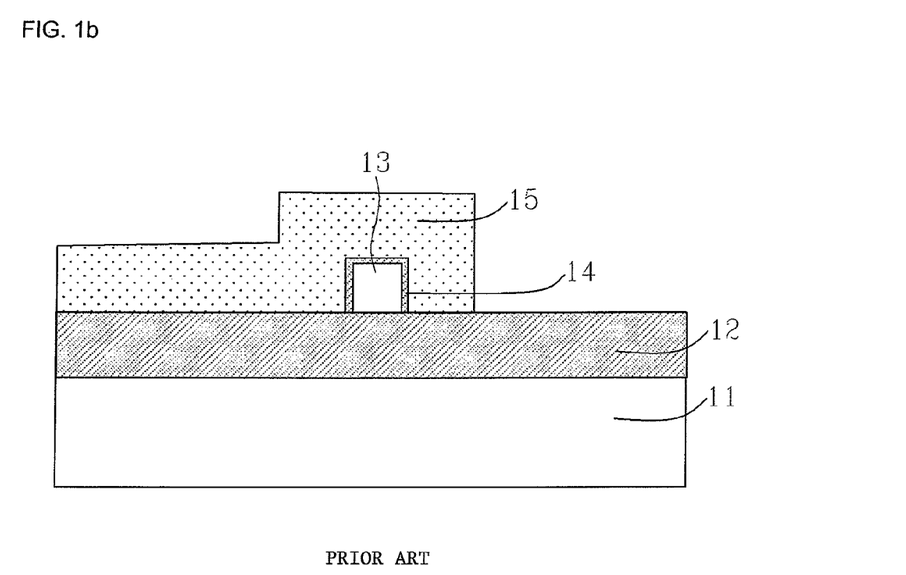

Recently, a tri-gate structure which extends a concept of the dual-gate structure has been introduced. A conventional tri-gate FinFET is manufactured on a silicon on insulator ("SOI") substrate that a silicon layer 11, an oxide layer 12 and a silicon layer 13 are stacked as shown in FIGS. 1a and 1b. A silicon pattern 13 of a fin structure formed by patterning the silicon layer 13 defines source and drain regions 13a and 13b and a channel region 13c. The channel region 13c between the source and drain regions 13a and 13b is formed to have a width smaller than those of the source and drain regions 13a and 13b. A gate oxide layer 14 is formed on a surface of the silicon pattern 13 corresponding to the channel region 13c. A gate electrode 15 is formed on the gate oxide layer 14 and the oxide layer 12.

A nano-level FinFET having a single silicon fin 13 has a tri-gate structure such that the gate electrode 15 is formed to cover an upper surface and both side surfaces, i.e., three (3) surfaces of the silicon fin 13.

Thus, a full depletion layer is formed in the silicon fin 13 of the channel region 13c below the gate electrode 15 due to a voltage applied to the gate electrode 15 and the source and drain regions 13a and 13b, and as gate and drain voltages are increased, a drain current is increased through an edge of the silicon fin 13 of the channel region 13c.

The tri-gate FinFET has an advantage in that a height H and a width W of the silicon fin are diversely changeable compared to the dual-gate FinFET. However, a drain current according to a gate voltage is almost constant since a cross-section area (H*W) of the silicon fin is almost constantly maintained, and the height of the silicon fin is restricted by a channel width that the full depletion is required. Here, a magnitude of the drain current is determined by the width and the height of the silicon fin, and accordingly a specification of the gate and drain voltages and the silicon fin becomes a major parameter which determines a device characteristic. As described above, the conventional tri-gate FinFET has a structural limitation in increasing the drain current. As a result, there is a limitation in obtaining current driving capability per unit area in terms of integration.

SUMMARY OF THE INVENTION

The present invention is directed to a multi-gate MOS transistor having an increased channel width in order to increase current driving capability and a method of manufacturing the same.

The present invention is also directed to a multi-gate MOS transistor which forms a structure that two silicon fins are perpendicularly stacked using a silicon on insulator (SOI) substrate and uses four (4) side surfaces of an upper silicon fin and three (3) side surfaces of a lower silicon fin as a channel, and a method of manufacturing the same.

One aspect of the present invention is to provide a multi-gate MOS transistor, comprising: a substrate including a lower silicon layer, a buried oxide layer, and an upper silicon layer and having a trench formed in a predetermined region thereof by etching portions of the upper silicon layer, the buried oxide layer, and the lower silicon layer; a silicon fin located in the trench, having a structure that a lower silicon fin, an oxide layer, and an upper silicon fin are sequentially stacked, and having a space formed by removing the oxide layer of a channel region between source and drain regions; a gate insulating layer formed around the lower silicon fin and the upper silicon fin of the channel region; and a gate electrode formed on the gate insulating layer of the channel region to fill the space.

Another aspect of the present invention is to provide a multi-gate MOS transistor, comprising: a substrate including a lower silicon layer, a buried oxide layer, and an upper silicon layer and having a trench formed in a predetermined region thereof by etching portions of the upper silicon layer, the buried oxide layer, and the lower silicon layer; a silicon fin located in the trench, having a structure that a lower silicon fin, an oxide layer, and an upper silicon fin are sequentially stacked, and having a space formed by removing the oxide layer of a channel region between source and drain regions; a gate insulating layer formed around the lower silicon fin and the upper silicon fin of the channel region; an insulating layer formed around the silicon fin of a portion of the source and drain regions adjacent to the channel region; and a gate electrode formed on the gate insulating layer and the insulating layer of the channel region to fill the space.

Yet another aspect of the present invention is to provide a method of manufacturing a multi-gate MOS transistor, comprising: providing a substrate having a structure that a lower silicon layer, a buried oxide layer, and an upper silicon layer are sequentially stacked; forming an oxide layer pattern on the upper silicon layer; etching some thickness of in exposed portions of the upper silicon layer, the buried oxide layer, and the lower silicon layer to form a trench, so that a structure that a lower silicon fin, an oxide layer, and an upper silicon fin are sequentially stacked in the trench is formed; forming an oxide layer on sidewalls of the fin structure, and then forming a silicon nitride layer on the entire surface of the fin structure; forming an insulating layer on the exposed lower silicon layer; etching the silicon nitride layer of a channel region and etching an exposed portion of the oxide layer, an oxide layer pattern, and an oxide layer to form an empty space between the upper silicon fin and the lower silicon fin of the channel region; forming a gate insulating layer on exposed surfaces of the upper silicon fin and the lower silicon fin and then forming a gate electrode on the gate insulating layer to fill the empty space; and implanting ions into the upper silicon fin and the lower silicon fin located at both sides of the gate electrode to form a source and a drain.

BRIEF DESCRIPTION OF THE DRAWINGS

The above and other features of the present invention will be described in reference to certain exemplary embodiments thereof with reference to the attached drawings in which:

FIG. 1b is a cross-sectional view taken along the line A1-A2 of FIG. 1a;

DETAILED DESCRIPTION OF PREFERRED EMBODIMENTS

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2A:
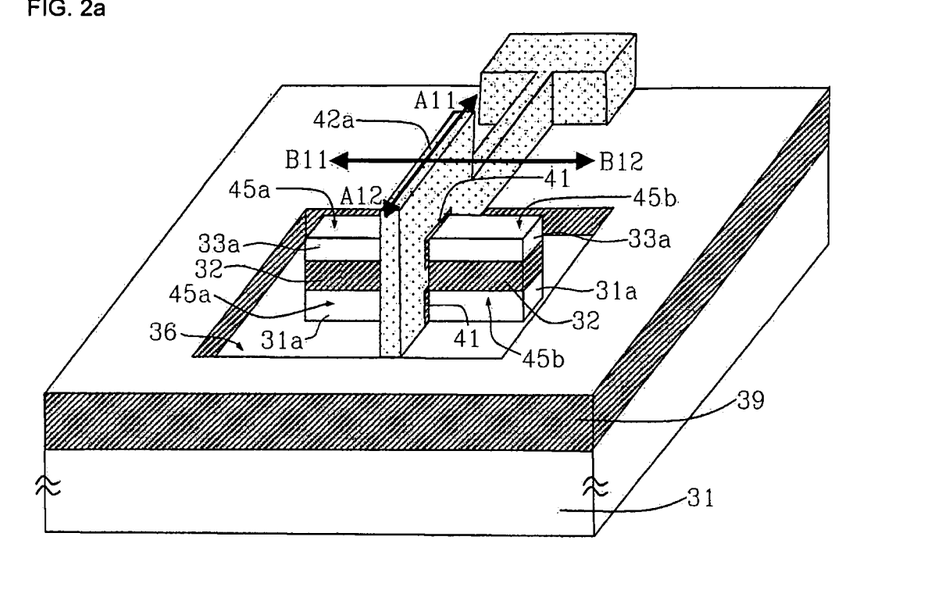
FIG. 2a is a perspective view illustrating a multi-gate MOS transistor in accordance with a first exemplary embodiment of the present invention.

FIG. 2a is a perspective view illustrating a multi-gate MOS transistor in accordance with a first exemplary embodiment of the present invention. The multi-gate MOS transistor in accordance with the first exemplary embodiment of the present invention is explained below, where references which are not shown will be explained with reference to FIG. 3 to FIG. 11.

An SOI substrate having a structure that a lower silicon layer 31, a buried oxide layer 32, and an upper silicon layer 33 are sequentially stacked is used. Some thickness of the upper silicon layer 33, the buried oxide layer 32, and the lower silicon layer 31 is etched to form a trench 36 in a predetermined region of the substrate. A silicon fin 30 having a structure that a lower silicon fin 31a, an oxide layer 32, and an upper silicon fin 33a are sequentially stacked is located in the trench 36. An insulating layer 39 is formed between the lower silicon fin 31a and the lower silicon layer 31 for electrical insulation. The lower silicon fin 31a, the oxide layer 32, and the upper silicon fin 33a which constitute the silicon fin 30 are composed of the lower silicon layer 31, the buried oxide layer 32, and the upper silicon layer 33, respectively.

The silicon fin 30 includes a channel region located at a central portion thereof and source and drain regions located at both sides of the channel region. A portion of the oxide layer 32 between the lower silicon fin 31a and the upper silicon fin 33a of the channel region is removed to form a space (portion "A" of FIGS. 7a and 7b). In the source and drain regions, a source 45a and a drain 45b having a lightly doped drain ("LDD") structure are formed. A gate insulating layer 41 is formed to surround the lower silicon fin 31a and the upper silicon fin 33a of the channel region, and a gate electrode 42a is formed on the gate insulating layer 41 to bury the space. That is, the gate electrode 42a is formed to surround the lower silicon fin 31a and the upper silicon fin 33a of the channel region, and extend to the outside of the trench 36. The gate electrode 42a is electrically insulated from the lower silicon layer 31 in the trench 36 and the upper silicon layer 33 outside the trench 36 by the insulating layer 39.

Figure 2B:
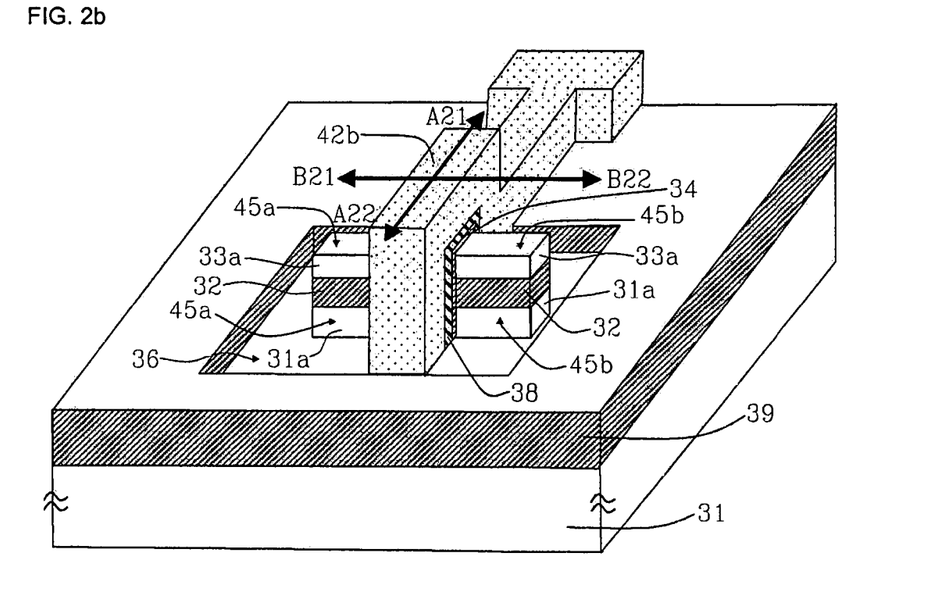
FIG. 2b is a perspective view illustrating a multi-gate MOS transistor in accordance with a second exemplary embodiment of the present invention.

FIG. 2b is a perspective view illustrating a multi-gate MOS transistor in accordance with a second exemplary embodiment of the present invention. The multi-gate MOS transistor in accordance with the second exemplary embodiment of the present invention is explained below, where references which are not shown will be explained with reference to FIG. 3 to FIG. 8 and FIG. 12 to FIG. 14.

An SOI substrate having a structure that a lower silicon layer 31, a buried oxide layer 32, and an upper silicon layer 33 are sequentially stacked is used. Some thickness of the upper silicon layer 33, the buried oxide layer 32, and the lower silicon layer 31 is etched to form a trench 36 in a predetermined region of the substrate. The silicon fin 30 having a structure that a lower silicon fin 31a, an oxide layer 32, and an upper silicon fin 33a are sequentially stacked is located in the trench 36. An insulating layer 39 is formed between the lower silicon fin 31a and the lower silicon layer 31 for electrical insulation. The lower silicon fin 31a, the oxide layer 32, and the upper silicon fin 33a which constitute the silicon fin 30 are composed of the lower silicon layer 31, the buried oxide layer 32, and the upper silicon layer 33, respectively.

The silicon fin 30 includes a channel region located at a central portion thereof and source and drain regions located at both sides of the channel region. A portion of the oxide layer 32 between the lower silicon fin 31a and the upper silicon fin 33a of the channel region is removed to form a space (portion "A" of FIGS. 7a and 7b). In the source and drain regions, a source 45a and a drain 45b having a lightly doped drain ("LDD") structure is formed.

An oxide layer 34 and a silicon nitride layer 38 are formed to surround the silicon fin 30 of a portion of the source and drain regions adjacent to the channel region, and a gate insulating layer 41 is formed to surround the lower silicon fin 31a and the upper silicon fin 33a of the channel region. A gate electrode 42b is formed on the gate insulating layer 41 and the silicon nitride layer 38 of the channel region to bury the space. That is, the gate electrode 42b is formed to surround the lower silicon fin 31a and the upper silicon fin 33a of the channel region. Here, since the gate electrode 42b covers an upper portion of the silicon nitride 38 which is formed to surround the silicon fin 30 of a portion of the source and drain regions, the gate electrode 42b is formed to have a letter "T" shape which is larger in width than the gate electrode 42a of the multi-gate MOS transistor in accordance with the first exemplary embodiment of the present invention. The gate electrode 42b extends to the outside of the trench 36 and is electrically insulated from the lower silicon layer 31 in the trench 36 and the upper silicon layer 33 outside the trench 36 by the insulating layer 39.

The structure of the multi-gate MOS transistor in accordance with the second exemplary embodiment of the present invention is similar to that of the multi-gate MOS transistor in accordance with the first exemplary embodiment of the present invention, but since the gate electrode 42b has a T shape, it has the electrical characteristics that a high electric filed effect is relieved at an edge of the gate electrode 42b, thereby the reliability of a device is high.

A method of manufacturing the multi-gate MOS transistor in accordance with the present invention will be explained below.

FIG. 3 to FIG. 11 are cross-sectional views illustrating a method of manufacturing a multi-gate MOS transistor in accordance with a first exemplary embodiment of the present invention. FIGS. 4a, 5a, 6a, 7a, 8a, 9a, 10a, and 11a are cross-sectional views taken along the line A11-A12 of FIG. 2a, and FIGS. 4b, 5b, 6b, 7b, 8b, 9b, 10b, and 11b are cross-sectional views taken along the line B11-B12 of FIG. 2a.

Figure 3:
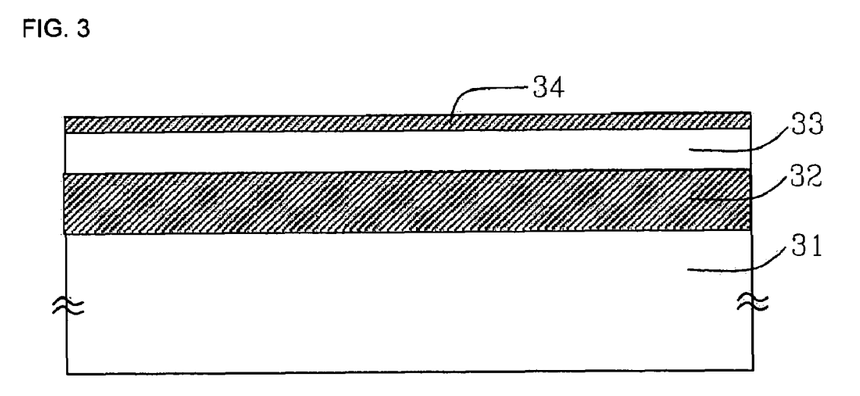
FIG. 3 is a cross-sectional view illustrating an SOI substrate in accordance with the present invention.

Referring to FIG. 3, an SOI substrate having a structure that a lower silicon layer 31, a buried oxide layer 32, and an upper silicon layer 33 are sequentially stacked is prepared. An oxide layer 34 is formed to a predetermined thickness on the upper silicon layer 33 of the SOI substrate.

Figure 4A:
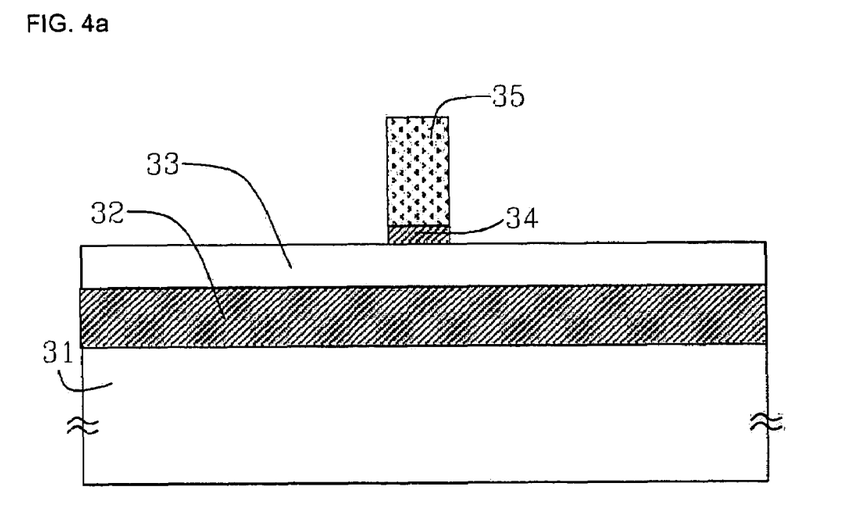
FIG. 4 to FIG. 11 are cross-sectional views illustrating a multi-gate MOS transistor in accordance with a first exemplary embodiment of the present invention.
Figure 4B:
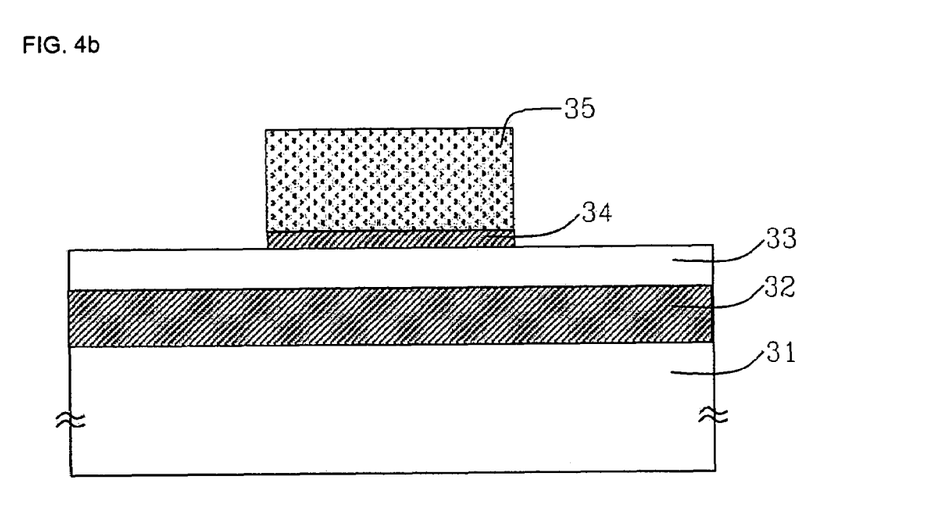

Referring to FIGS. 4a and 4b, a photoresist layer 35 is formed on the oxide layer 34 and then patterned by a photolithography process, and the oxide layer 34 is patterned by an etching process using the patterned photoresist layer as a mask. At this time, the oxide layer 34 is patterned to have the same width and length as a silicon fin which will be formed.

Figure 5A:
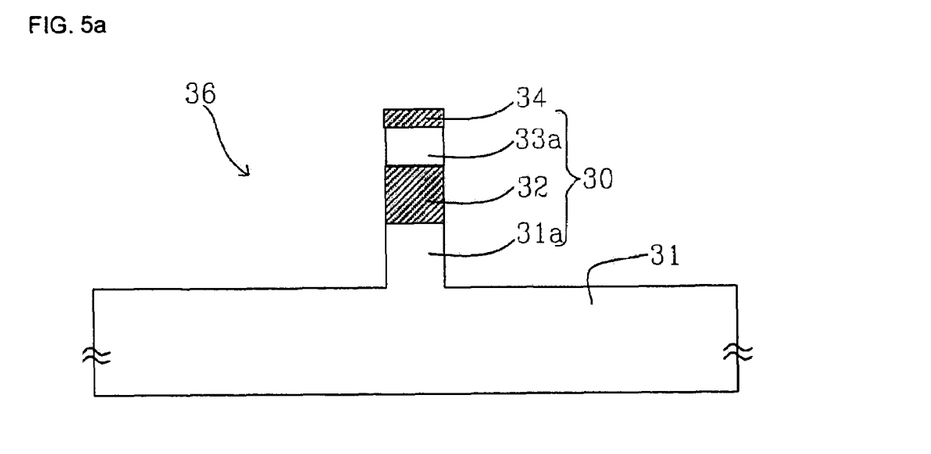
Figure 5B:
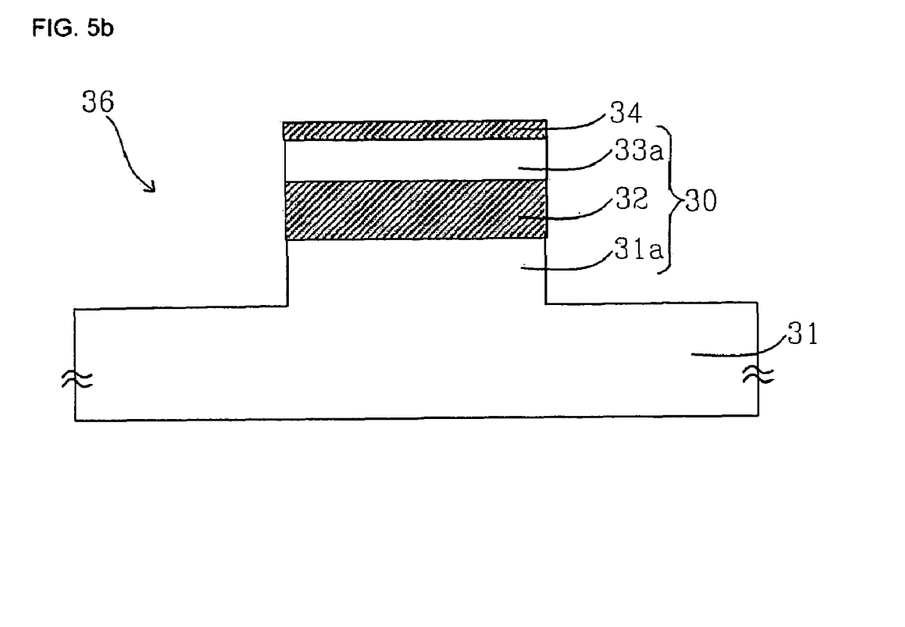

Referring to FIGS. 5a and 5b, some thickness of the upper silicon layer 33, the buried oxide layer 32, and the lower silicon layer 31, which are exposed by an etching process using the photoresist layer 35 as a mask, is sequentially removed to form a trench 36 having a predetermined size, and then the photoresist layer 35 is removed. As a result, a silicon fin 30 having a shape of a vertical pole that the lower silicon layer 31, the buried oxide layer 32, the upper silicon layer 33, and the oxide layer 34 are sequentially stacked in the trench 36 is formed. Here, a portion composed of some thickness of the lower silicon layer 31 becomes a lower silicon fin 31a, and a portion composed of the upper silicon layer 33 becomes an upper silicon fin 31a. The silicon fin 30 includes a channel region located at a central portion thereof and source and drain regions located at both sides of the channel region.

Figure 6A:
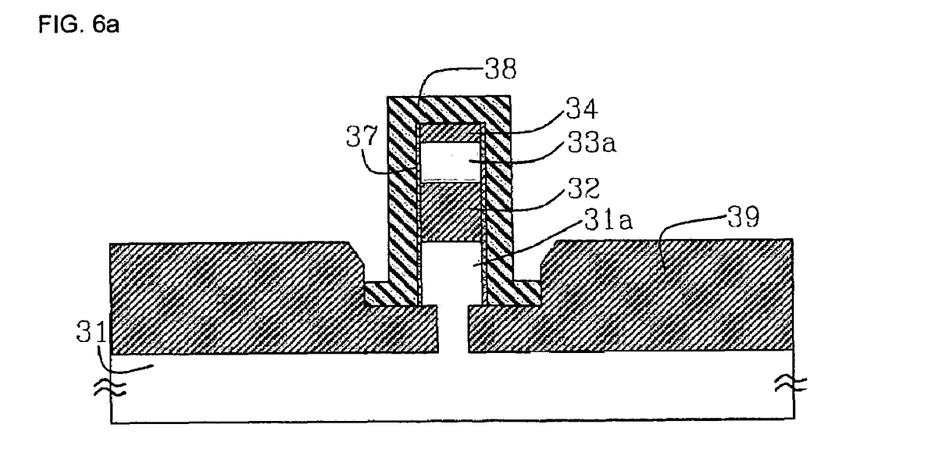
Figure 6B:
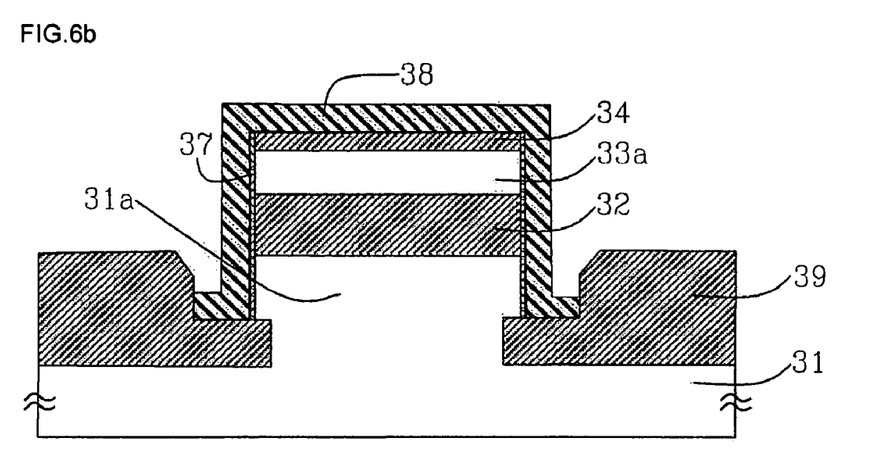

Referring to FIGS. 6a and 6b, an oxide layer 37 having a relatively thin thickness is grown on both sidewalls of the silicon fin 30 to protect surfaces of the upper silicon fin 33a and the lower silicon fin 31a. A silicon nitride layer 38 is deposited on the entire surface of the substrate, and thereafter photolithography and etching processes using a photoresist layer (not shown) are performed to remain the silicon nitride layer 38 only on the surface of the silicon fin 30.

After removing the photoresist layer, a high temperature oxidation process is performed to grow a relatively thick oxide layer 39 on the lower silicon layer 31 in the trench 36 except for the silicon nitride layer 38. At this time, it is preferable that the oxide layer 39 having a predetermined depth is grown into the lower silicon layer 31 below the silicon nitride layer 38. That is, a predetermined distance between the lower silicon fin 31a and the lower silicon layer 31 is secured, so that heat generated during operation of a device is effectively transferred to the lower silicon layer 31, and electrical insulation is maintained by a depletion layer during operation of the device.

Figure 7A:
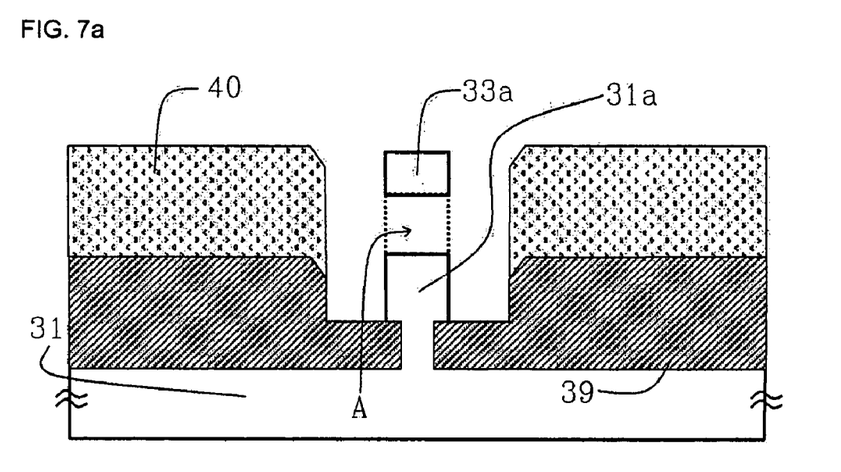
Figure 7B:
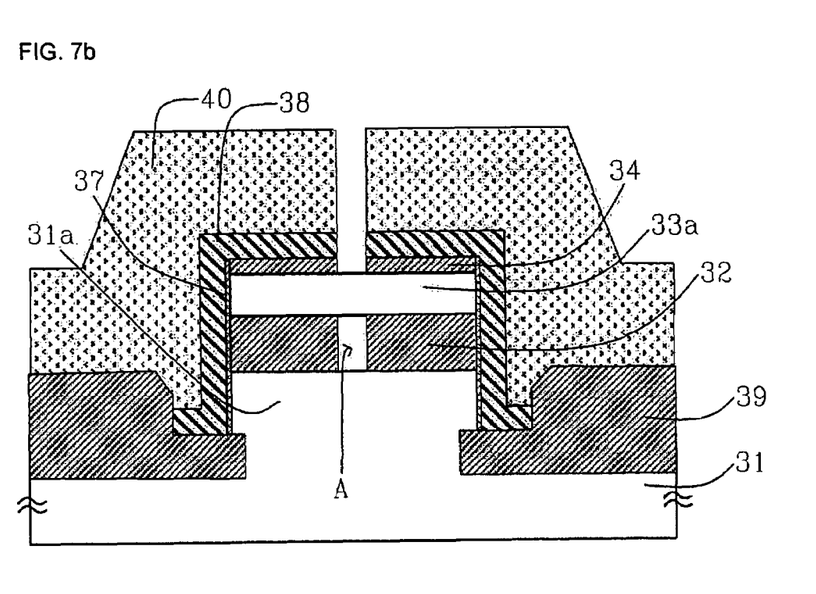

Referring to FIGS. 7a and 7b, a photoresist layer 40 is formed on the entire surface of the substrate and is patterned to expose the silicon nitride layer 38 of the channel region. An exposed portion of the silicon nitride layer 38 is removed by a dry etching process or a wet etching process, and then the exposed portion of the oxide layer 37, the oxide layer 34, and the buried oxide layer 32 are removed by an isotropic etching process so that an empty space (portion A) is formed between the upper silicon fin 33a and the lower silicon fin 31a of the channel region.

Figure 8A:
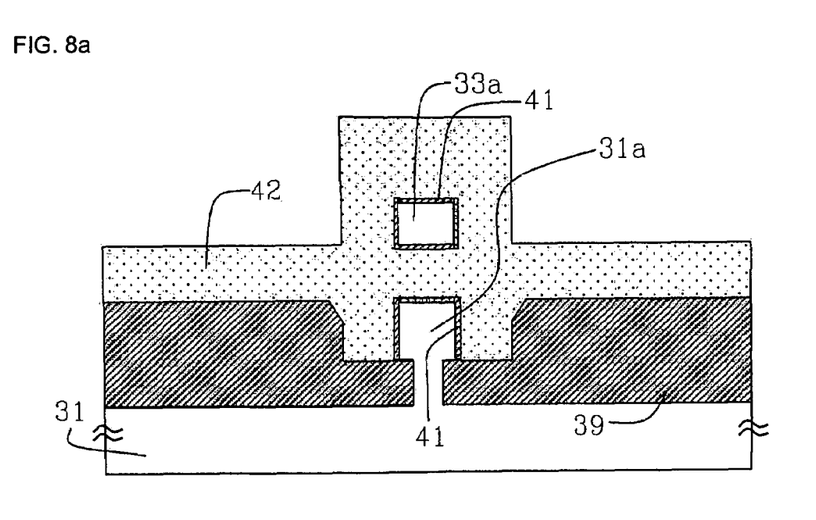
Figure 8B:
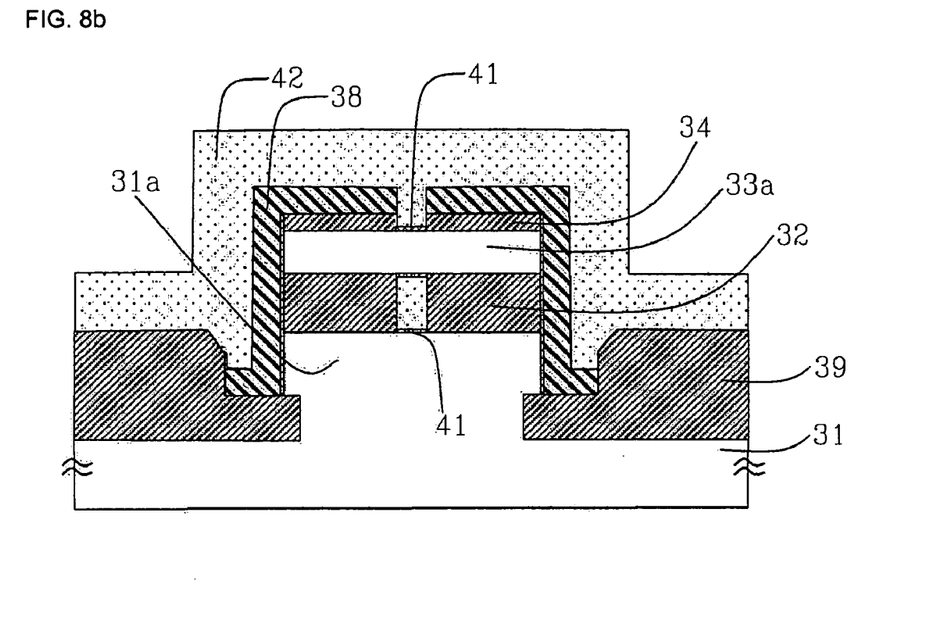

Referring to FIGS. 8a and 8b, the photoresist layer 40 is removed, and a gate insulating layer 41 is formed on the exposed surfaces of the upper silicon fin 33a and the lower silicon fin 31a, and thereafter a gate conductive layer 42 is formed on the entire surface of the substrate to fill the empty space A. The gate insulating layer 41 may be made of $SiO_2$, $HfO_2$ or a mixed high-k dielectric layer, and the gate conductive layer 42 may be made of doped polysilicon, or a metal material such as molybdenum Mo or metal silicide.

Figure 9A:
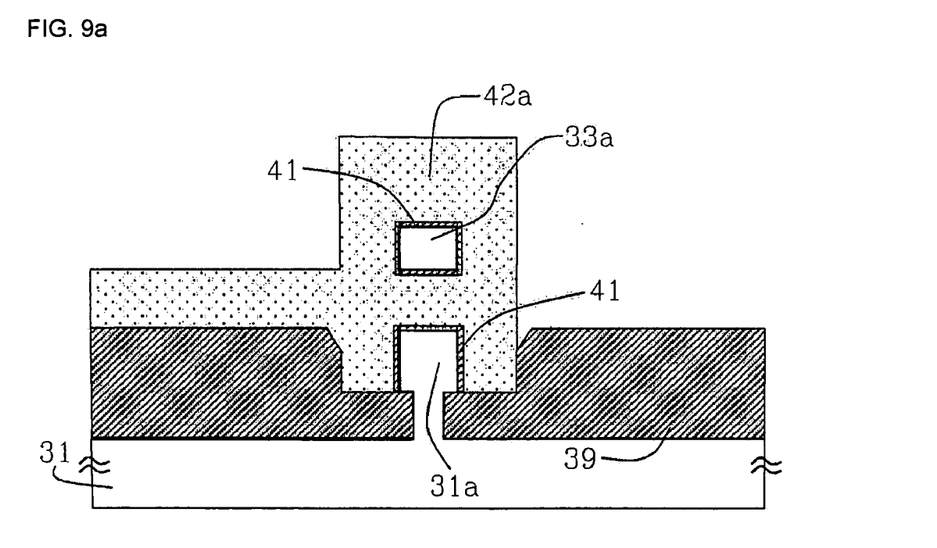
Figure 9B:
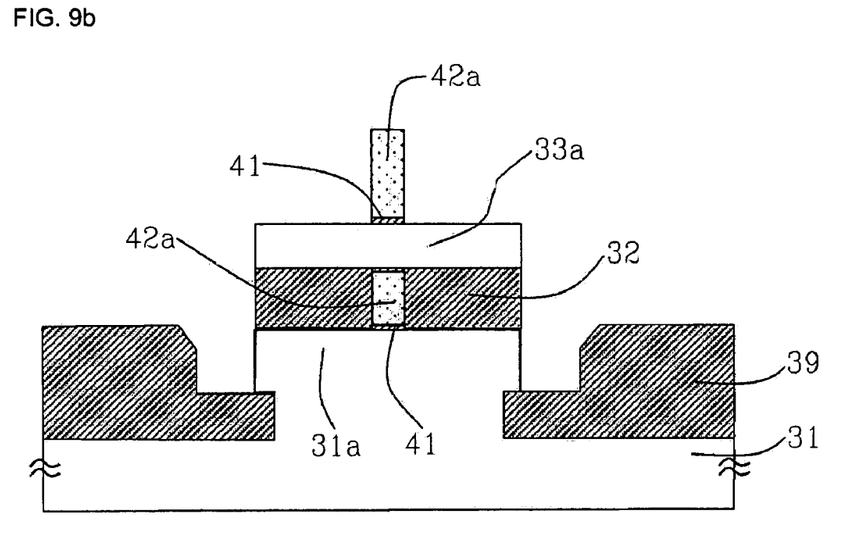
Figure 10A:
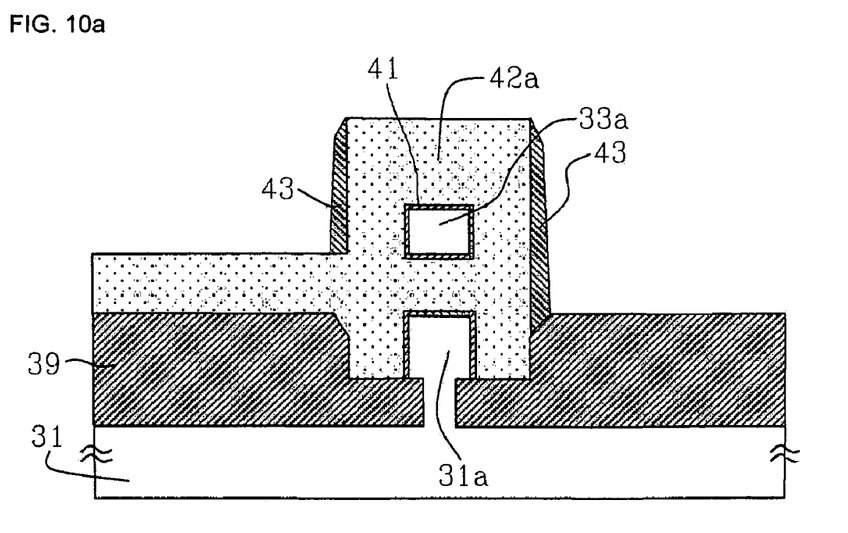
Figure 10B:
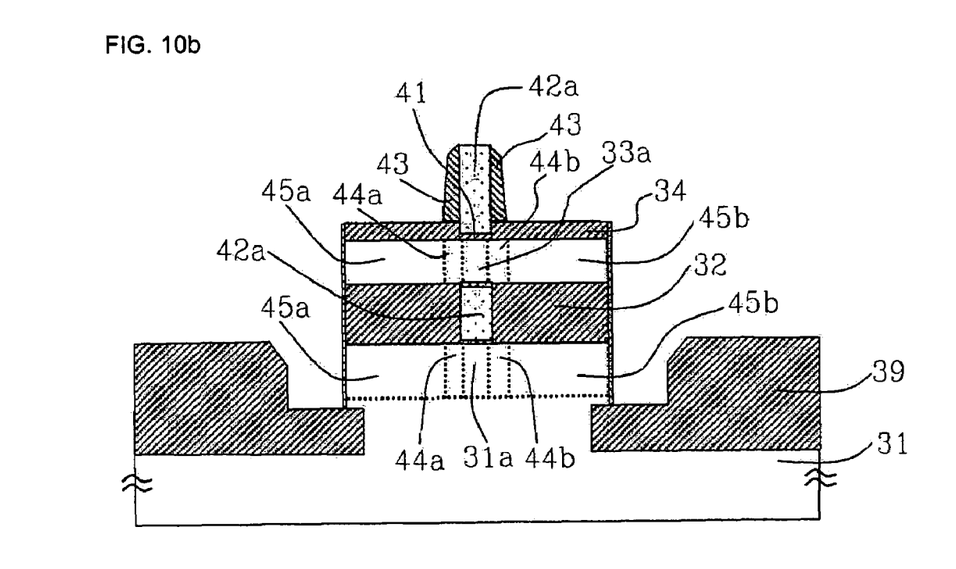

Referring to FIGS. 9a and 9b, a photoresist layer pattern (not shown) is formed to define a gate region, and then the exposed portion of the gate conductive layer 42 and the silicon nitride layer 38 are sequentially etched to thereby form a gate electrode 42a which extends to one side while surrounding the upper silicon fin 33a and the lower silicon fin 31a of the channel region Referring to FIGS. 10a and 10b, LDD ions are implanted into the upper silicon fin 33a and the lower silicon fin 31a located at both sides of the gate electrode 42a to thereby form LDD regions 44a and 44b. Subsequently, an insulating layer is deposited on the entire surface of the substrate and etched by a reactive ion etching process to form an insulating spacer 43 on sidewalls of the gate electrode 42a. Impurity ions are implanted to the upper silicon fin 33a and the lower silicon fin 31a located at both sides of the gate electrode 42a, and then an annealing process is perform to form a source 45a and a drain 45b having an LDD structure, respectively. As the LDD ions and the ions used to form the source and drain, n-type ions are used for an NMOS device, and p-type ions are used for a PMOS device. The ions are slantly implanted at a predetermined angle so that the ions can uniformly be implanted into the upper silicon fin 33a and the lower silicon fin 31a.

Figure 11A:
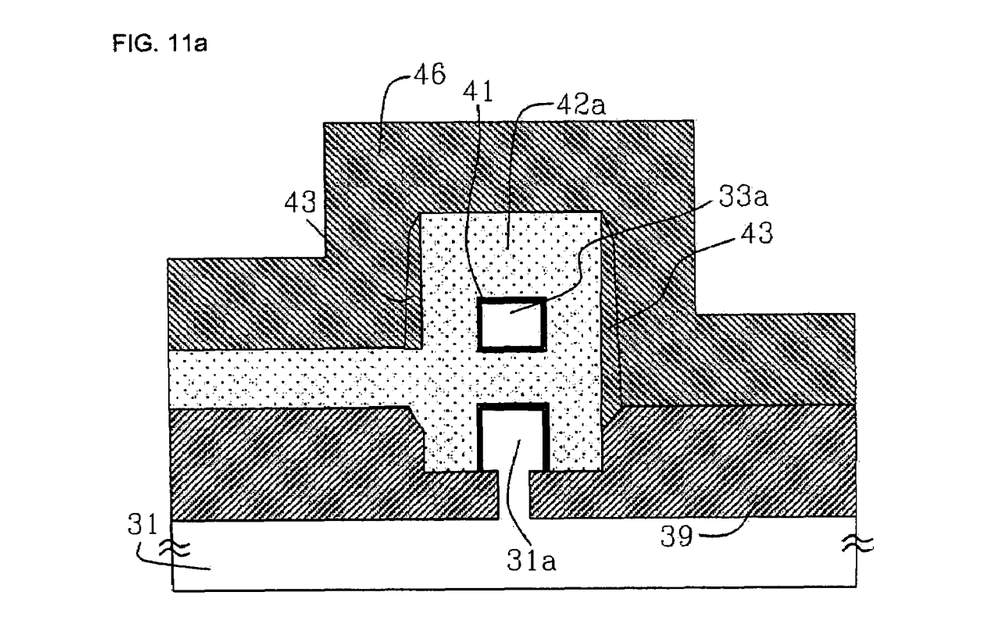
Figure 11B:
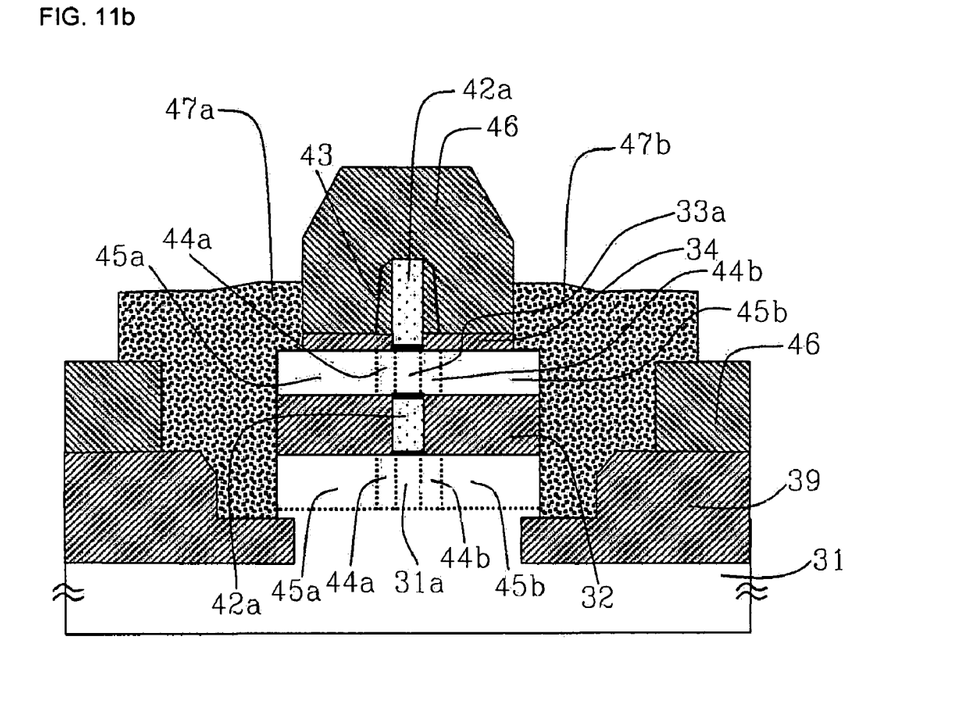

Referring to FIGS. 11a and 11b, an interlayer insulating layer 46 is formed on the entire surface of the substrate and then is patterned by a photolithography process and a dry-etching process using a contact mask to form contact holes which expose portions of the source and drain 45a and 45b. A metal layer is deposited on the entire surface of the substrate to fill the contact holes and then patterned to form source and drain electrodes 47a and 47b which come in contact with the source and drain 45a and 45b respectively, while forming a gate metal electrode (not shown). Thereafter, an annealing process is performed.

For the sake of the process performed above, the thickness of the upper silicon layer 33 and the buried oxide layer 32 should be appropriately set, an etching technique for etching some thickness of the buried oxide layer 32 and lower silicon layer 31 when forming the trench 36 to form the silicon fin 30 and a technique for growing the thick high temperature oxide layer 39 on the lower silicon layer 31 to optimize a structure of the lower silicon fin 31a are required. Also, in order to secure the excellent electrical characteristics, a full depletion layer should be formed in the lower silicon fin 31a and the upper silicon fin 33a of the channel region by a voltage applied to the gate electrode 42a.

Meanwhile, a method of manufacturing a multi-gate MOS transistor in accordance with the second exemplary embodiment of the present invention will be explained with reference to FIG. 12 to FIG. 14. FIGS. 12a, 13a, and 14a are cross-sectional views taken along the line A21-A22 of FIG. 2b, and FIGS. 12b, 13b, and 14b are cross-sectional views taken along the line B21-B22 of FIG. 2b.

Figure 12A:
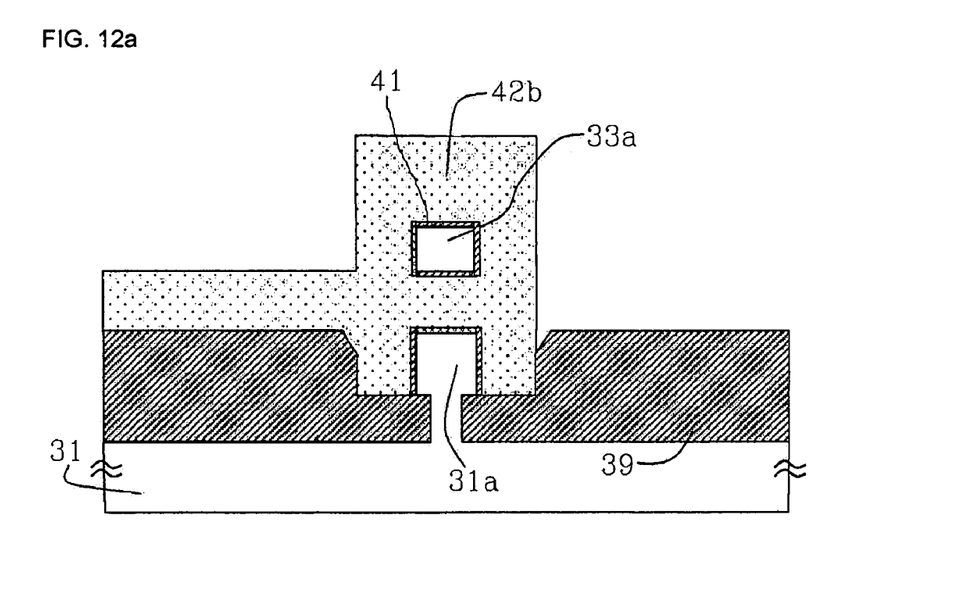
FIG. 12 to FIG. 14 are cross-sectional views illustrating a multi-gate MOS transistor in accordance with a second exemplary embodiment of the present invention.
Figure 12B:
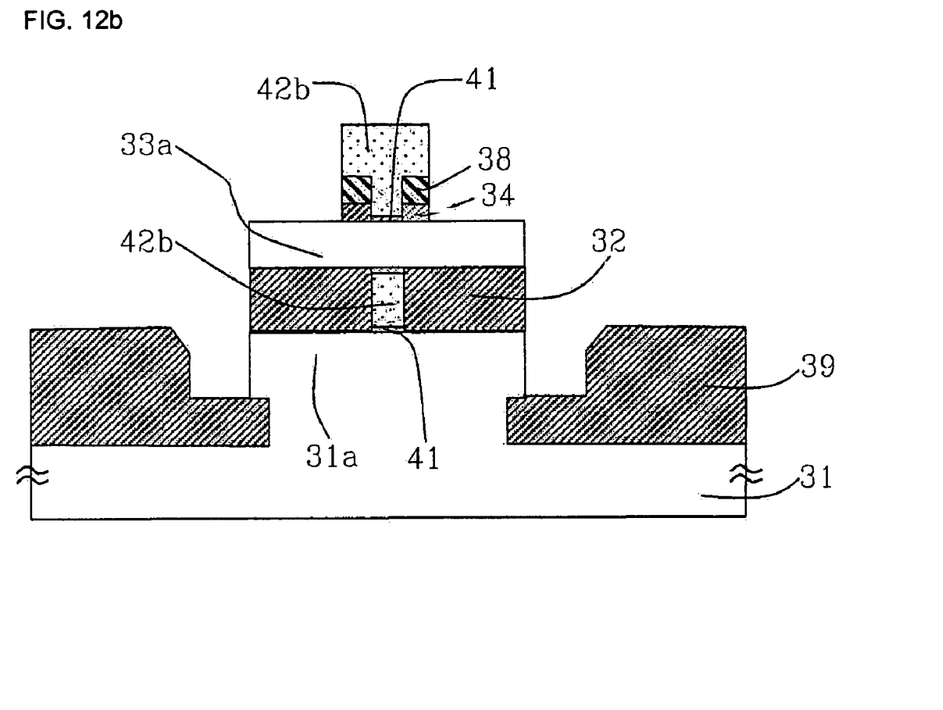

After forming the structure of FIGS. 8a and 8b in the same way as the first exemplary embodiment, as shown in FIGS. 12a and 12b, a photoresist layer pattern (not shown) is formed to define a T-shaped gate. The exposed portions of the gate conductive layer 42 and the silicon nitride layer 38 are sequentially etched to form a T-shaped gate electrode 42b which surrounds the upper silicon fin 33a and the lower silicon fin 31a and extends to one side. At this time, since the gate electrode 42b covers the silicon nitride layer 38 formed around the silicon fin 30 of a portion of the source and drain regions, the gate electrode 42b is formed in a T shape wider than the gate electrode 42a of the first exemplary embodiment of the present invention.

Figure 13A:
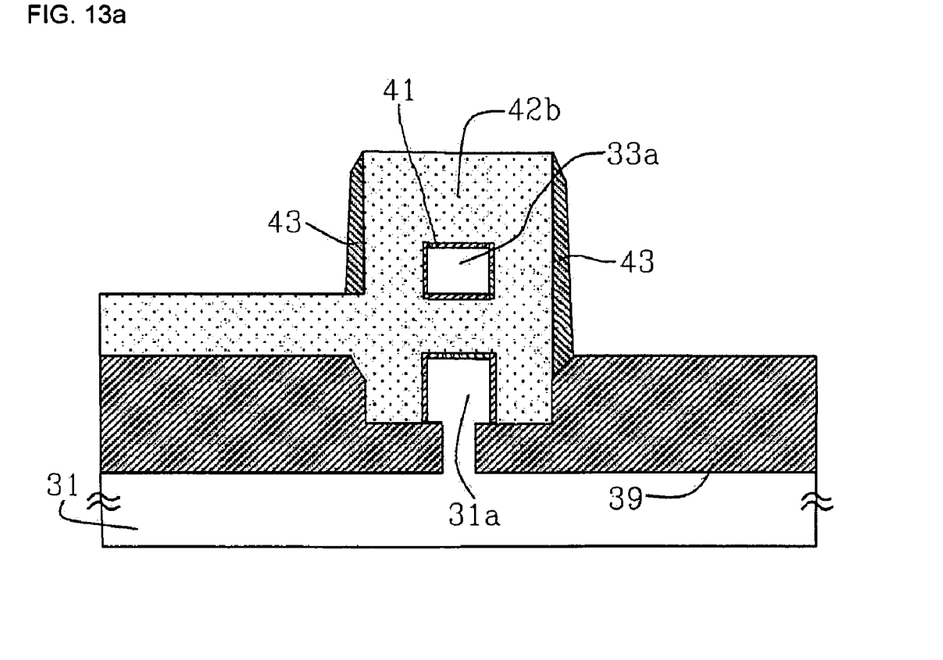
Figure 13B:
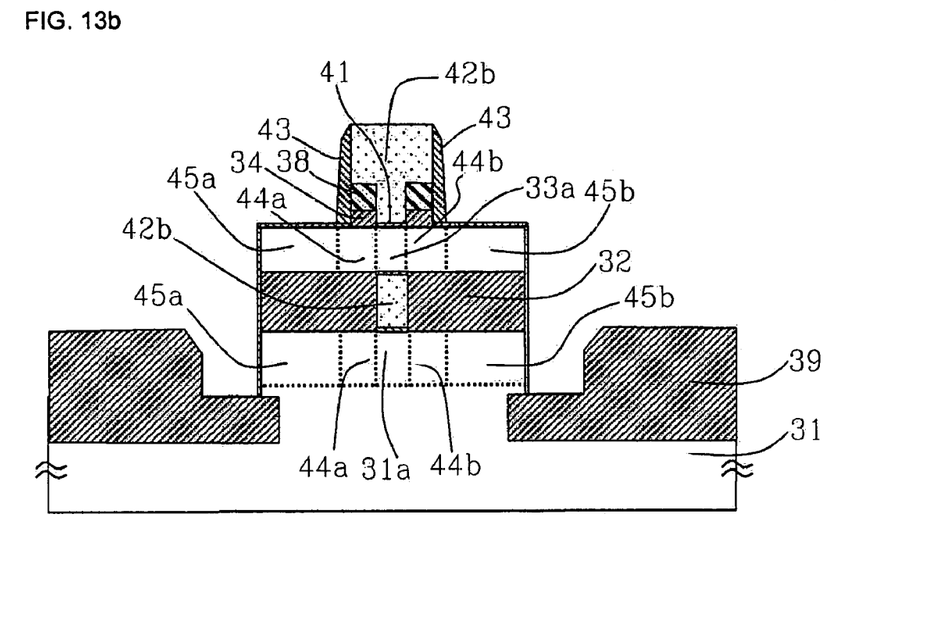

Referring to FIGS. 13a and 13b, LDD ions are implanted into the upper silicon fin 33a and the lower silicon fin 31a located at both sides of the gate electrode 42a to form LDD regions 44a and 44b, respectively. An insulating layer is deposited on the entire surface of the substrate and etched by a reactive ion etching process to form an insulating spacer 43 on the sidewalls of the gate electrode 42b. Impurity ions are implanted into the upper silicon fin 33a and the lower silicon fin 31a located at both sides of the gate electrode 42b, and then an annealing process is performed, thereby forming the source and drain 45a and 45b having an LDD structure. As the LDD ions and the ions used to form the source and drain, n-type ions are used for an NMOS device, and p-type ions are used for a PMOS device. The ions are slantly implanted at a predetermined angle so that the ions can uniformly be implanted to the upper silicon fin 33a and the lower silicon fin 31a.

Figure 14A:
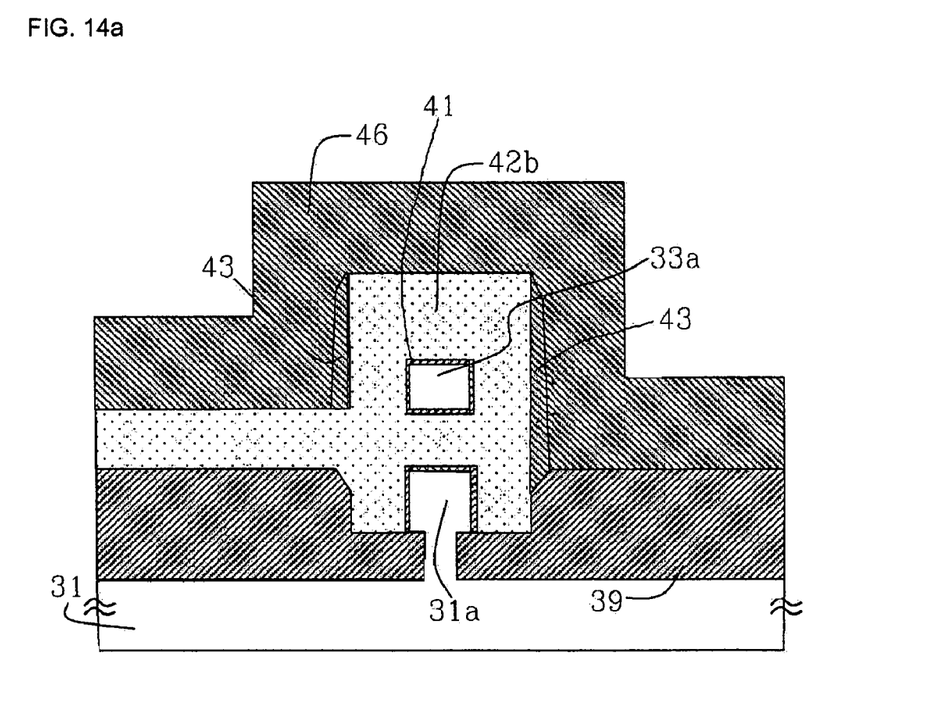
Figure 14B:
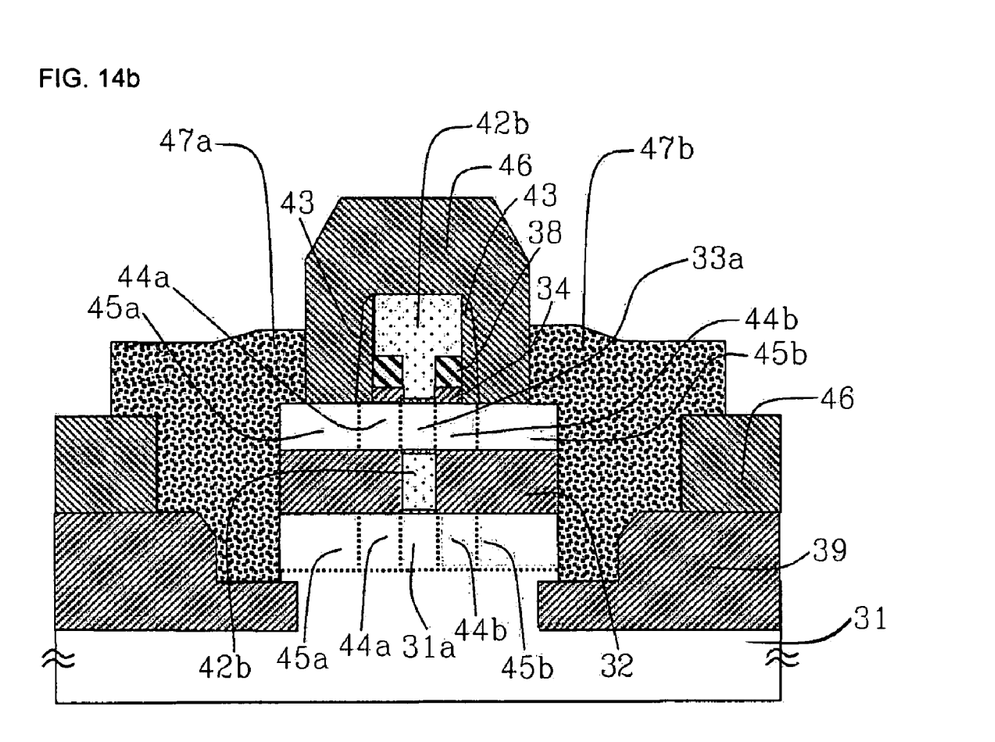

Referring to FIGS. 14a and 14b, an interlayer insulating layer 46 is formed on the entire surface of the substrate and then is patterned by a photolithography process and a dry-etching process using a contact mask to form contact holes which expose portions of the source and drain 45a and 45b. A metal layer is deposited on the entire surface of the substrate to fill the contact holes and then patterned to form source and drain electrodes 47a and 47b which come in contact with the source and drain 45a and 45b respectively, while forming a gate metal electrode (not shown). Thereafter, an annealing process is performed.

As described herein above, according to the present invention, a structure that two silicon fins are vertically stacked using the SOI substrate is formed, and four side surfaces of the upper silicon fin and three side surfaces of the lower silicon fin are used as a gate. Therefore, a channel width is increased, so that a drain current per unit area is increased to improve current driving capability of a device, which leads to high integration compared to the conventional device. Also, through optimization and stability of the process, high performance nano-level semiconductor IC and highly integrated memory IC can be manufactured.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A multi-gate MOS transistor, comprising:
   a substrate including a lower silicon layer, a buried oxide layer, and an upper silicon layer, and having a trench formed in a predetermined region thereof by etching portions of the upper silicon layer, the buried oxide layer, and the lower silicon layer;
   a silicon fin located in the trench, having a structure that a lower silicon fin, an oxide layer, and an upper silicon fin are sequentially stacked, and having a space formed by removing the oxide layer of a channel region between source and drain regions;
   a gate insulating layer formed around the lower silicon fin and the upper silicon fin of the channel region; and
   a gate electrode formed on the gate insulating layer of the channel region to fill the space.

2. The multi-gate MOS transistor as set forth in claim 1, wherein an insulating layer is formed between the lower silicon fin and the lower silicon layer for electrical insulation.

3. The multi-gate MOS transistor as set forth in claim 2, wherein the gate electrode is formed to extend to an outside of the trench, and the lower silicon layer in the trench and the upper silicon layer outside the trench are electrically insulated by the insulating layer.

4. The multi-gate MOS transistor as set forth in claim 1, wherein the lower silicon fin, the oxide layer, and the upper silicon fin which constitute the silicon fin include the lower silicon layer, the buried oxide layer, and the upper silicon layer, respectively.

5. The multi-gate MOS transistor as set forth in claim 1, wherein the source and drain regions have a lightly doped drain (LDD) structure.

6. The multi-gate MOS transistor as set forth in claim 1, wherein the gate insulating layer is formed of any one of $SiO_2$, $HfO_2$, and a mixed high-k dielectric layer, and the gate electrode is formed of any one of doped polysilicon, molybdenum (Mo), and metal silicide.

7. A multi-gate MOS transistor, comprising:
   a substrate including a lower silicon layer, a buried oxide layer, and an upper silicon layer, and having a trench formed in a predetermined region thereof by etching portions of the upper silicon layer, the buried oxide layer, and the lower silicon layer;
   a silicon fin located in the trench, having a structure that a lower silicon fin, an oxide layer, and an upper silicon fin are sequentially stacked, and having a space formed by removing the oxide layer of a channel region between source and drain regions;
   a gate insulating layer formed around the lower silicon fin and the upper silicon fin of the channel region;
   an insulating layer formed around the silicon fin of portions of the source and drain regions adjacent to the channel region; and
   a gate electrode formed on the gate insulating layer and the insulating layer of the channel region to fill the space.

8. The multi-gate MOS transistor as set forth in claim 7, wherein the insulating layer is formed of an oxide layer and a silicon nitride layer.

9. The multi-gate MOS transistor as set forth in claim 7, wherein a first insulating layer is formed between the lower silicon fin and the lower silicon layer for electrical insulation.

10. The multi-gate MOS transistor as set forth in claim 7, wherein the lower silicon fin, the oxide layer, and the upper silicon fin which constitute the silicon fin include the lower silicon layer, the buried oxide layer, and the upper silicon layer, respectively.

11. The multi-gate MOS transistor as set forth in claim 7, wherein the source and drain regions have a lightly doped drain (LDD) structure.

12. The multi-gate MOS transistor as set forth in claim 7, wherein the gate electrode is formed to extend to an outside of the trench, and the lower silicon layer in the trench and the upper silicon layer outside the trench are electrically insulated by the insulating layer.

13. The multi-gate MOS transistor as set forth in claim 7, wherein the gate insulating layer is formed of any one of $SiO_2$, $HfO_2$, and a mixed high-k dielectric layer, and the gate electrode is formed of any one of doped polysilicon, molybdenum (Mo), and metal silicide.

14. A method of manufacturing a multi-gate MOS transistor, comprising:
  providing a substrate having a structure that a lower silicon layer, a buried oxide layer, and an upper silicon layer are sequentially stacked;
  forming a first oxide layer pattern on the upper silicon layer;
  etching some thickness in exposed portions of the upper silicon layer, the buried oxide layer, and the lower silicon layer to form a trench, so that a structure that a lower silicon fin, the buried oxide layer, an upper silicon fin and a first oxide layer are sequentially stacked in the trench is formed;
  forming a second oxide layer on sidewalls of the fin structure, and then forming a silicon nitride layer on an entire surface of the fin structure;
  forming an insulating layer on the exposed lower silicon layer;
  etching the silicon nitride layer of a channel region and etching an exposed portion of the second oxide layer, the first oxide layer pattern, and the buried oxide layer to form an empty space between the upper silicon fin and the lower silicon fin of the channel region;
  forming a gate insulating layer on the exposed surfaces of the upper silicon fin and the lower silicon fin and then forming a gate electrode on the gate insulating layer to fill the empty space; and
  implanting ions into the upper silicon fin and the lower silicon fin located at both sides of the gate electrode to form a source and a drain.

15. The method as set forth in claim 14, wherein the lower silicon fin, the oxide layer and the upper silicon fin which constitute the fin structure include the lower silicon layer, the buried oxide layer, and the upper silicon layer, respectively.

16. The method as set forth in claim 14, wherein the insulating layer is formed to extend below the lower silicon fin.

17. The method as set forth in claim 14, wherein the second oxide layer, the first oxide layer pattern, and the buried oxide layer are etched by an isotropic etching process to form the empty space.

18. The method as set forth in claim 14, wherein the gate insulating layer is formed of any one of $SiO_2$, $HfO_2$, and a mixed high-k dielectric layer, and the gate electrode is formed of any one of doped polysilicon, molybdenum, (Mo), and metal silicide.

19. The method as set forth in claim 14, wherein the gate electrode has a letter T shape.

20. The method as set forth in claim 14, wherein the source and drain regions have an LDD structure.

21. The method as set forth in claim 14, wherein the ions are slantly implanted.

* * * * *